United States Patent
Carlough et al.

(10) Patent No.: US 10,771,068 B2
(45) Date of Patent: Sep. 8, 2020

(54) REDUCING CHIP LATENCY AT A CLOCK BOUNDARY BY REFERENCE CLOCK PHASE ADJUSTMENT

(71) Applicant: INTERNATIONAL BUSINESS MACHINES CORPORATION, Armonk, NY (US)

(72) Inventors: Steven R. Carlough, Poughkeepsie, NY (US); Susan M. Eickhoff, Hopewell Junction, NY (US); Michael W. Harper, Round Rock, TX (US); Michael B. Spear, Round Rock, TX (US); Gary A. Van Huben, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 265 days.

(21) Appl. No.: 15/899,370

(22) Filed: Feb. 20, 2018

(65) Prior Publication Data
US 2019/0260380 A1   Aug. 22, 2019

(51) Int. Cl.
*H03L 7/085* (2006.01)
*H03L 7/081* (2006.01)
(Continued)

(52) U.S. Cl.
CPC .............. *H03L 7/085* (2013.01); *G06F 1/06* (2013.01); *G06F 1/10* (2013.01); *G06F 11/1604* (2013.01); *H03L 7/081* (2013.01); *H04L 7/0037* (2013.01)

(58) Field of Classification Search
CPC .................... H03L 7/085; G06F 1/10
See application file for complete search history.

(56) References Cited

U.S. PATENT DOCUMENTS 6,337,589 B1 * 1/2002 Ooishi ............... G11C 7/22
  327/156
6,654,824 B1 * 11/2003 Vila ................. H04L 25/14
  710/52

(Continued)

FOREIGN PATENT DOCUMENTS

| EP | 0644524 A1 | 3/1995 |
| EP | 1404020 A1 | 3/2004 |
| EP | 2302831 B1 | 6/2012 |

OTHER PUBLICATIONS

Rhee Woogeun, "A Continuously Tunable LC-VCO PLL with Bandwidth Linearization Techniques for PCI Express Gen2 Applications", Tsinghua University, May 16, 2014, 11 pages.

(Continued)

*Primary Examiner* — Kim Huynh
*Assistant Examiner* — Joshua Neveln
(74) *Attorney, Agent, or Firm* — Bryan Bortnick; Amy J. Pattillo

(57) ABSTRACT

A calibration controller of a receiving chip learns a difference between a first clock phase of an input clock for controlling inputs on a data path to a buffer of the receiving chip at a clock boundary and a second clock phase of a chip clock for controlling outputs from the buffer on the data path at the clock boundary. The calibration controller dynamically adjusts a phase of a reference clock driving a phase locked loop that outputs the chip clock to adjust the second clock phase of the chip clock with respect to the first clock phase to minimize a latency on the data path at the clock boundary to a half a cycle granularity.

14 Claims, 8 Drawing Sheets

(51) Int. Cl.
    *G06F 11/16*         (2006.01)
    *G06F 1/10*          (2006.01)
    *G06F 1/06*          (2006.01)
    *H04L 7/00*         (2006.01)

(56) References Cited

U.S. PATENT DOCUMENTS

| | | |
|---|---|---|
| 8,073,090 B2 | 12/2011 | Zhang et al. |
| 8,866,556 B2 | 10/2014 | Rogers |
| 2001/0046266 A1 | 11/2001 | Rakib et al. |
| 2005/0008110 A1* | 1/2005 | Lake .................. H04L 7/0012 |
| | | 375/371 |
| 2011/0096930 A1 | 4/2011 | Walmsley |
| 2014/0314190 A1 | 10/2014 | Chalasani et al. |
| 2016/0011996 A1 | 1/2016 | Asaad et al. |

OTHER PUBLICATIONS

Burnett, Jon, "Serdes High-Speed I/O Implementation", Freescale Technology Forum, Apr. 2014, 178 pages.

Schoeberl, Martin, et al,. "Towards a time-predictable dual-issue microprocessor: The PATMOS approach", Bringing Theory to Practice: Predictability and Performance in Embedded Systems. vol. 18. 2011, 11 pages.

\* cited by examiner

REDUCING CHIP LATENCY AT A CLOCK BOUNDARY BY REFERENCE CLOCK PHASE ADJUSTMENT

BACKGROUND

1. Technical Field

This invention relates in general to computing systems and more particularly to reducing chip latency at a clock boundary by adjusting a reference clock phase.

2. Description of the Related Art

Computing systems generally include one or more circuits with one or more chips. Timing variations, frequency, temperature, aging, and other conditions impact data transfer rates between chips, which impacts computer system performance. In addition, in a computer system where a host chip implements a serializer/deserializer (SerDes) based, high speed serial (HSS) interface for interfacing with another chip, timing variations at clock boundaries between the host and other chip have the potential to significantly impact timing margins within the computer system, thereby increasing chip latency.

BRIEF SUMMARY

In one embodiment, a method is directed to learning a difference between a first clock phase of an input clock for controlling inputs on a data path to a buffer of a receiving chip at a clock boundary and a second clock phase of a chip clock for controlling outputs from the buffer on the data path at the clock boundary. The method is directed to running, by the computer system, a first test line sequence on the data path comprising a plurality of line test cycles. The method is directed to observing, by the computer system, a comparison of data rising output from the buffer on a rising edge of the chip clock compared with an output of a pattern generator in comparison with an expected output. The method is directed to, in response to the comparison matching the expected output, decrementing, by the computer system, a load to unload delay across the clock boundary by advancing each of an unload pointer for controlling output from the buffer and the pattern generator by two chip clock cycles in one line test cycle of the plurality of line test cycles. The method is directed to observing, by the computer system, the comparison of the data rising output from the buffer on the rising edge of the chip clock compared with the output of the pattern generator in comparison with the expected output. The method is directed to, in response to the comparison not matching the expected output, incrementing, by the computer system, the load to unload delay by freezing each of the unload pointer and the pattern generator by one chip clock cycle in the one line test cycle. The method is directed to capturing and comparing, by the computer system, the data rising output from the buffer on the rising edge of the chip clock compared with the data falling output from the buffer on the falling edge of the chip clock. The method is directed to dynamically adjusting a phase of a reference clock driving a phase locked loop that outputs the chip clock to adjust the second clock phase of the chip clock with respect to the first clock phase to minimize a latency on the data path at the clock boundary to a half a cycle granularity.

In another embodiment, a computer system comprises one or more processors, one or more computer-readable memories, one or more computer-readable storage devices, and program instructions, stored on at least one of the one or more storage devices for execution by at least one of the one or more processors via at least one of the one or more memories. The stored program instructions comprise program instructions to learn a difference between a first clock phase of an input clock for controlling inputs on a data path to a buffer of a receiving chip at a clock boundary and a second clock phase of a chip clock for controlling outputs from the buffer on the data path at the clock boundary. The stored program instructions comprise program instructions to run a first test line sequence on the data path comprising a plurality of line test cycles. The stored program instructions comprise program instructions to observe a comparison of data rising output from the buffer on a rising edge of the chip clock compared with an output of a pattern generator in comparison with an expected output. The stored program instructions comprise, in response to the comparison matching the expected output, program instructions to decrement a load to unload delay across the clock boundary by advancing each of an unload pointer for controlling output from the buffer and the pattern generator by two chip clock cycles in one line test cycle of the plurality of line test cycles. The stored program instructions comprise program instructions to observe the comparison of the data rising output from the buffer on the rising edge of the chip clock compared with the output of the pattern generator in comparison with the expected output. The stored program instructions comprise program instructions, in response to the comparison not matching the expected output, to increment the load to unload delay by freezing each of the unload pointer and the pattern generator by one chip clock cycle in the one line test cycle. The stored program instructions comprise program instructions to capture and compare the data rising output from the buffer on the rising edge of the chip clock compared with the data falling output from the buffer on the falling edge of the chip clock. The stored program instructions comprise program instructions to program instructions to dynamically adjust a phase of a reference clock driving a phase locked loop that outputs the chip clock to adjust the second clock phase of the chip clock with respect to the first clock phase to minimize a latency on the data path at the clock boundary to a half a cycle granularity.

In another embodiment, a computer program product comprises one or more computer-readable storage devices and program instructions, stored on at least one of the one or more storage devices. The stored program instructions comprise program instructions to learn a difference between a first clock phase of an input clock for controlling inputs on a data path to a buffer of a receiving chip at a clock boundary and a second clock phase of a chip clock for controlling outputs from the buffer on the data path at the clock boundary. The stored program instructions comprise program instructions to run a first test line sequence on the data path comprising a plurality of line test cycles. The stored program instructions comprise program instructions to observe a comparison of data rising output from the buffer on a rising edge of the chip clock compared with an output of a pattern generator in comparison with an expected output. The stored program instructions comprise, in response to the comparison matching the expected output, program instructions to decrement a load to unload delay across the clock boundary by advancing each of an unload pointer for controlling output from the buffer and the pattern generator by two chip clock cycles in one line test cycle of the plurality of line test cycles. The stored program instructions comprise program instructions to observe the comparison of the data rising output from the buffer on the rising edge of the chip clock compared with the output of the pattern generator in comparison with the expected output. The stored program instructions comprise program instructions, in response to the comparison not matching the expected output, to increment the load to unload delay by freezing each of the unload pointer and the pattern generator by one chip clock cycle in the one line test cycle. The stored program instructions comprise program instructions to capture and compare the data rising output from the buffer on the rising edge of the chip clock compared with the data falling output from the buffer on the falling edge of the chip clock. The stored program instructions comprise program instructions to program instructions to dynamically adjust a phase of a reference clock driving a phase locked loop that outputs the chip clock to adjust the second clock phase of the chip clock with respect to the first clock phase to minimize a latency on the data path at the clock boundary to a half a cycle granularity.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth to provide a thorough understanding of the present invention. It will be apparent, however, to one skilled in the art that the present invention may be practiced without these specific details. In other instances, well-known structures and devices are shown in block diagram form to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
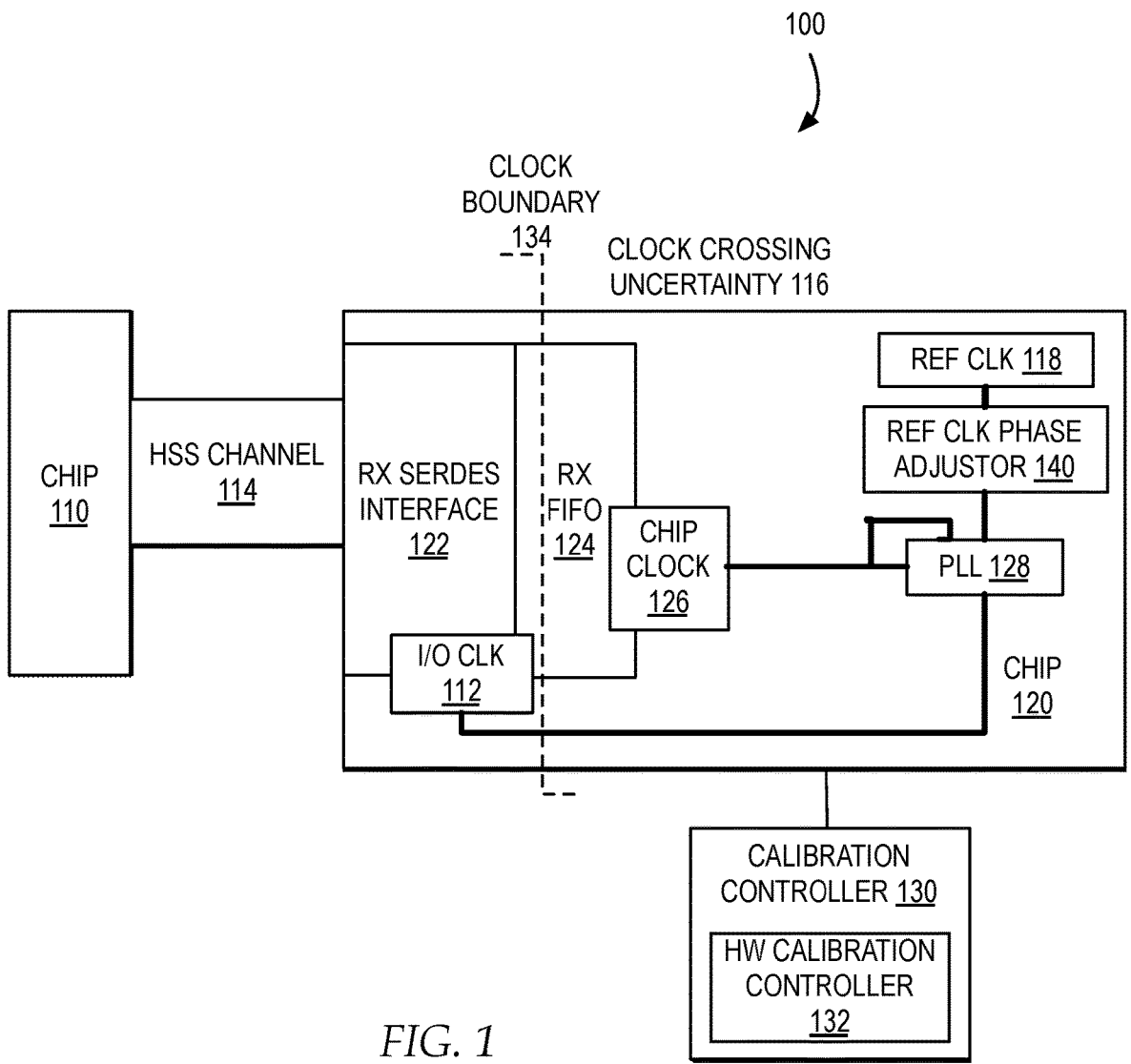
FIG. 1 is a block diagram illustrating one example of a system for reducing chip latency by minimizing uncertainty at a clock boundary by dynamically adjusting a reference clock phase.

FIG. 1 illustrates a block diagram of one example of a system for reducing chip latency by minimizing uncertainty at a clock boundary by dynamically adjusting a reference clock phase.

In one example, a system 100 includes a chip 110, connected via an HSS channel 114, to a chip 120. In one example, chip 110 may represent a master device, such as a processor, and chip 120 may represent a slave device, such as an accelerator. In one example, chip 110 may represent a host device and chip 120 may represent a memory device. In additional or alternate examples, system 100 may include additional or alternate chips. In additional or alternate examples, chip 110 and chip 120 may represent additional or alternate type and configurations of one or more cascaded chips.

In one example, chip 110 and chip 120 may be connected through a high speed serial (HSS) channel 114. In one example, HSS channel 122 may represent a SerDes based channel. In one example, HSS channel 122 may represent multiple differential high-speed uni-directional channels. In additional or alternate embodiments, chip 110 and chip 120 may be connected through one or more additional or alternate types of channels at one or more frequencies.

In one example, by the nature of HSS operating at high speeds, data passing through HS S channel 114 may operate at a different, faster frequency from chip 120. For example, it may be beneficial for chip 120 to run a core chip clock 126 at lower frequencies to reduce complexity and minimize power consumption on chip 120, which may result in a faster speed of operation of HSS channel 114 and the slower speed of operation of chip 120.

In one example, chip 120 may include a receiver (RX) SerDes interface 122 for receiving data at a first frequency from HSS channel 114, where chip 120 may function at a second frequency slower than the first frequency. In one example, RX SerDes interface 122 may deserialize data received HSS channel 114 at the first frequency. In one example, a SerDes connection implemented in HSS channel 114 and RX SerDes interface 122 may represent one or more pairs of functional blocks, which may be used in high speed communications to convert data between serial data interfaces and parallel interfaces in each direction. In one example, RX SerDes interface 122 may include one or more of a parallel in serial out (PISO) block and a serial in parallel out (SIPO) block, configured in one or more different architectures, incorporating one or more types of clocks.

In one example, to handle deserialization of data from HSS channel 114, RX SerDes interface 122 may apply adaptive clock samplers, to set a phase of an I/O CLK 112 input to correctly capture and align the data from HSS channel 114. In one example, at initialization of system 100, the initial phase relationship between the resulting sampled data and adapted clock phase of I/O CLK 112 of RX SerDes interface 122 and a clock phase of chip clock 126, which drives data within chip 120, is unknown.

In one example, to adapt to the unknown phase relationship between the phase of I/O CLK 112 of RX SerDes interface 122 and a clock phase of chip clock 126, chip 120 may include an RX FIFO 124 to provide an additional buffer period for buffering data arriving on RX SerDes interface 122. In particular, the addition of RX FIFO 124 potentially adds latency to the data path in the form of one or more clock cycles of clock crossing uncertainty 116, at a clock boundary 134, as data is clocked into RX FIFO 124 by I/O CLK 124 and clocked out of RX FIFO 124 by chip clock 126. In one example, lower chip clock frequencies on chip 120 and higher SerDes widths of HSS channel 114 may further increase the number of clock cycles of uncertainty, unless a clock phase of chip clock 126 can be adapted relative to the phase of I/O clock 112 of RX SerDes interface 122 to reduce the delay of clock crossing uncertainty 116.

In one example, chip clock 126 may represent a clock signal from a clock distribution to RX FIFO 124 and other buffers and devices of chip 120. In one example, chip clock 126 may be driven by a phase-locked loop (PLL) 128, which applies an external feedback mechanism to a reference clock (REF CLK) 118 signal to generate chip clock 126, to constrain the phase of chip clock 126 from drift at the leaves of the clock tree. In one example, chip clock 126, as generated by PLL 128, may have a fixed system arrival time, and due to external feedback, guarantees a deterministic phase of chip clock 126. In one example, because of the external feedback path of PLL 128, adjustment of the clock phase directly on the output of PLL may not be feasible, and even if feasible, may require chip space for a large amount of additional circuitry.

In one example, chip 120 may access a calibration controller 130 for calibrating one or more tunable delay values applied within chip 120. In one example, calibration controller 130 may be positioned as hardware on chip 120. In another example, chip 120 may access calibration controller 130 as firmware accessible on a sideband connection. In additional or alternate examples, calibration controller 130 may be accessed by chip 120 on chip or off chip, and may include one or more of hardware, firmware, and software.

In one example, to reduce the latency added by RX FIFO 124 to the data path on chip 120, illustrated as clock crossing uncertainty 116 at clock boundary 134, calibration controller 130 may include a HW calibration controller 132 that dynamically learns the difference between the clock phase from I/O clock 112 of RX SerDes interface 122 and the clock phase of chip clock 126 and dynamically adjusts a phase of REF CLK 118 to effectively adjust the clock phase applied to RX FIFO 124 to reach a granularity of half a clock cycle of latency in clock crossing uncertainty 116. In addition, by adjusting a phase of REF CLK 118, HW calibration controller 132 is enabled to adjust the clock phase applied to RX FIFO 124 to reach a granularity of half a clock cycle of latency in clock crossing uncertainty 116, while also supporting an external feedback mechanism of PLL 128 to constrain the phase of chip clock 126 from drift.

In one example, to enable HW calibration controller 132 to dynamically adjust a phase of REF CLK 118, chip 120 may include a REF CLK phase adjustor 140 with an input that may be dynamically adjusted to adjust a phase of REF CLK 118. In one example, REF CLK phase adjustor 140 may include, but is not limited to, an exclusive or (XOR) gate, with an input of REF CLK 118 and a dynamically adjustable signal for selecting whether to shift a phase of REF CLK 118 by 180 degrees. In additional or alternate embodiments, other types of gates and logic may be applied by REF CLK phase adjustor 140 to adjust a phase of REF CLK 118.

In an additional or alternate embodiment, in one example, chip 120 may include, in addition to REF CLK phase adjustor 140, one or more delay lines automatically setting the I/O clock phase of RX SerDes interface 122 to position the clock phase of chip clock 126, as phase adjusted by PLL 128, to 180 degrees from the I/O clock phase. While statically timed delay lines alone may provide one mechanism for positioning the phase of I/O clock 112 in relation to the adjusted clock phase of chip clock 126, statically timed delay lines may only provide a preset phase shift. In the example, separately or in combination with statically timed delay lines, HW calibration controller 132 enables dynamic calibration of the phase shift. HW calibration controller 132 first dynamically learns actual phase positions of the phase of I/O clock 112 with respect to the adjusted clock phase of chip clock 126 and then selects an adjusted clock phase of chip clock 126 by dynamically adjusting REF CLK 118.

In the present invention, HW calibration controller 132 requires minimal additional circuitry on chip 120 for learning an actual clock phase of data output from RX FIFO 124 and directly, dynamically adjusting a phase of REF CLK 118 to set clock crossing uncertainty 116 to one half of a cycle. While in additional or alternate embodiments, in one example, chip 120 may include additional or alternate more complex circuitry for adjusting chip clock 126, HW calibration controller 132 is able to effectively adjust a clock phase of chip clock 126 in relation to a clock phase of I/O clock 112 with only the minimal circuitry of REF CLK phase adjustor 140, which dynamically adjusts a phase of REF CLK 118 only, to enable dynamic reduction of clock crossing uncertainty 116 to a half of a cycle of granularity with circuitry of a minimized size on chip 120.

In one example, HW calibration controller 132 may learn a current phase position of the clock phase of I/O clock 112 of RX SerDes interface 122 in comparison with a current phase position of chip clock 126 by assessing a sampling margin of the unload latch of RX FIFO 124 using rising edge and falling edge sample comparisons based on a first pass of link training by calibration controller 130. In one example, based on the value of the delay identified in the sampling margin, HW calibration controller 132 may determine whether or not to invert REF CLK 118, relock PLL 128, and run a second pass of link training. In one example, HW calibration controller 132 may continue to adjust REF CLK 118 and run additional passes of link training until clock crossing uncertainty 116 is reduced to a half cycle of granularity of delay.

Figure 2:
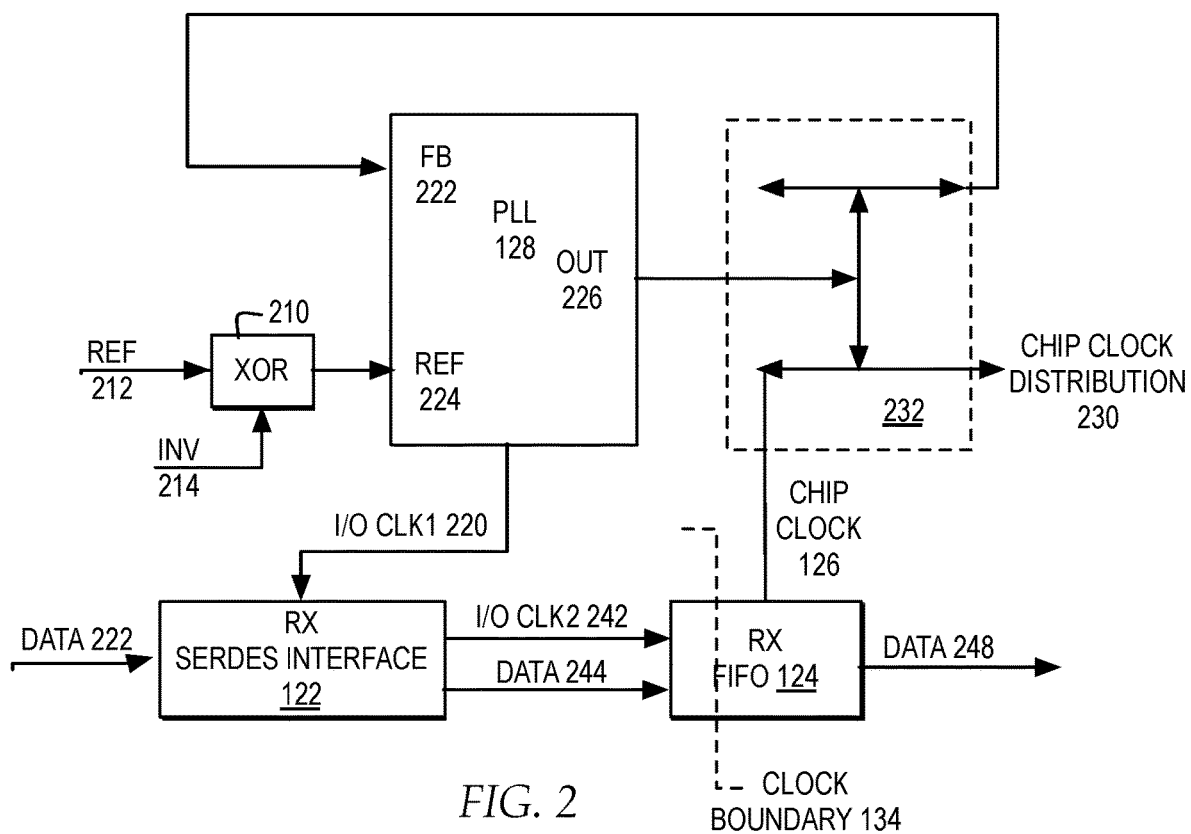
FIG. 2 is a block diagram illustrating one example of an external feedback loop controller of a phased lock loop with a reference clock phase adjustor for adjusting a phase of a chip clock for unloading a FIFO relative to the phase of an I/O clock for loading the FIFO, for minimizing uncertainty at a clock boundary to a half cycle granularity of delay.

FIG. 2 illustrates a block diagram of one example of an external feedback loop controller of a phased lock loop with a reference clock phase adjustor for adjusting a phase of a chip clock for unloading a FIFO relative to the phase of an I/O clock for loading the FIFO, for minimizing uncertainty at a clock boundary to a half cycle granularity of delay.

In one example, PLL 128 may include a first output (OUT) 226 that outputs a clock signal, which is distributed in a clock tree 232 as a chip clock distribution 230 to one or more components of chip 120, including, but not limited to, RX FIFO 126, as chip clock 126. In one example, an external feedback loop from OUT 226 to a feedback (FB) input 222, may constrain the phase of chip clock distribution 230 from drift at the leaves of clock tree 232. In one example, one or more elements of clock tree 232 may include one or more delay elements, such as, but not limited to, phase rotators.

In one example, PLL 128 may receive an input of reference clock (REF) 224, which is received from the output of an exclusive OR gate (XOR) 210 and outputs a high signal if only one of the inputs to XOR 210 is true. In one example, XOR 210 is an example of REF CLK phase adjustor 140.

In one example, PLL 128 may drive an output of an I/O CLK1 220 to RX SerDes interface 122, where I/O CLK1 220 is not constrained by clock tree 232. In one example, RX SerDes interface 122 may adjust the phase of I/O CLK1 220 and output a clock signal I/O CLK2 242, from I/O CLK1 220. In one example, RX SerDes interface 122 may phase adjust I/O CLK1 220 for output as I/O CLK2 242.

In addition, RX SerDes interface 122 may receive serialized data 222, deserialize data 222, and pass deserialized data 244 to RX FIFO 124. In one example, RX FIFO 124 may latch data 244 in response either a rising edge or a falling edge of I/O CLK2 242 or may be set to latch in response to both a rising edge and a falling edge of I/O CLK2 242. In one example, RX FIFO 124 may output latched data 244, as data 248, in response to each of a rising edge and a falling edge of an input of chip clock 126.

In one example, HW calibration controller 132 learns a difference in the phase I/O CLK 112, illustrated by I/O CLK2 242 in FIG. 2, and chip clock 126 by sampling data 248 on a rising edge and falling edge and comparing the sampled data to assess a sampling margin. In one example, XOR 210 may receive inputs from a reference clock (REF) 212 and from an inverter (INV) 214. In one example, by HW calibration controller 132 setting INV 214 to a high, or true, signal, HW calibration controller 132 may adjust the phase of REF 224 by 180 degrees. In one example, once HW calibration controller 132 learns the difference in phase of I/O CLK 242 and chip clock 126, HW calibration controller 132 may selectively adjust the input to INV 214 to control clock crossing uncertainty 116 at clock boundary 134 at a half a cycle granularity of delay. In one example, by selectively adjusting the input to INV 214 to control clock crossing uncertainty 116 at clock boundary 134, a phase of chip clock 126 is adjusted without requiring additional circuitry for, or adjusting, the external feedback mechanism of PLL 128 through clock tree 232 to FB 222 for guaranteeing a deterministic phase of chip clock 126.

Figure 3:
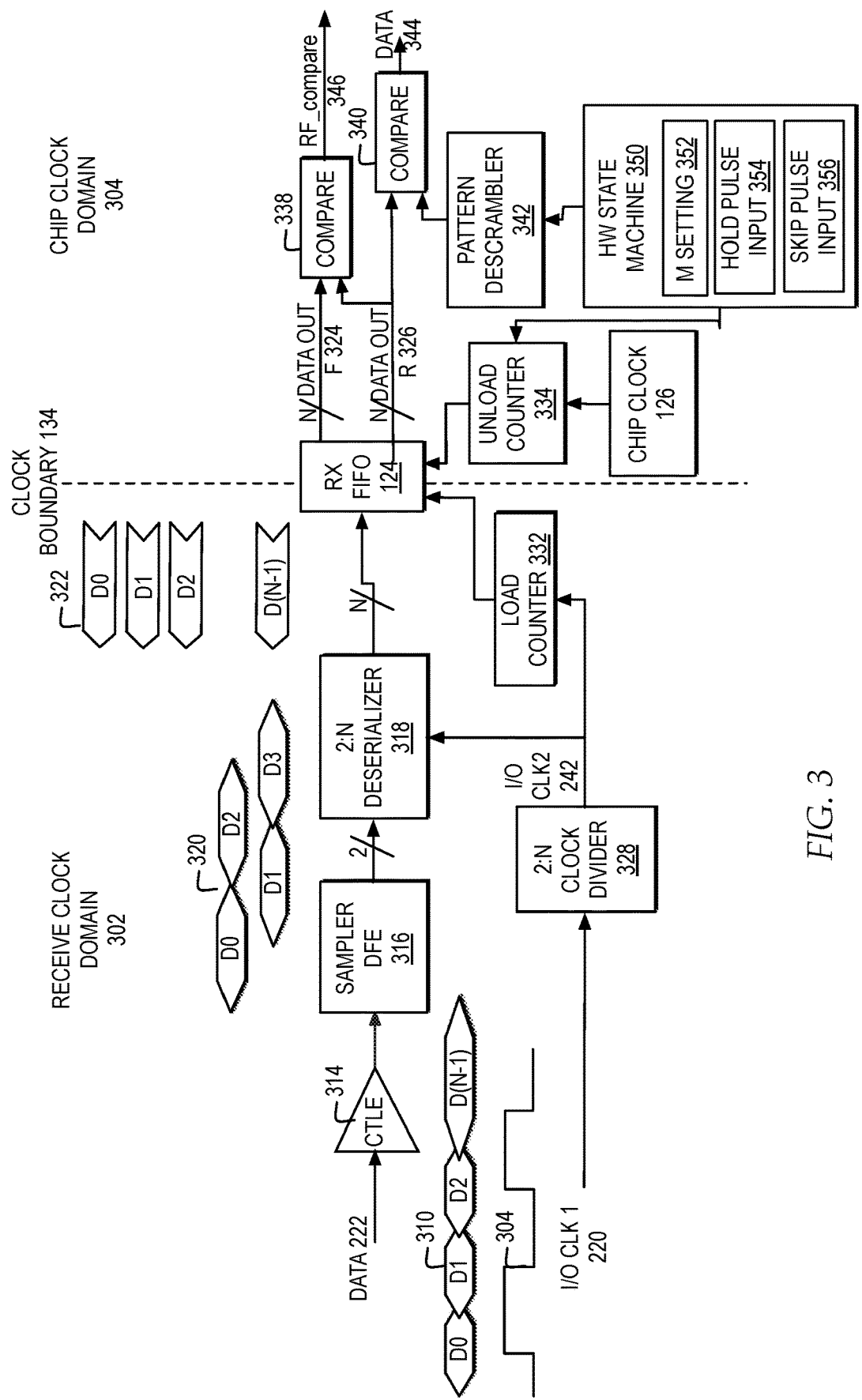
FIG. 3 is a block diagram illustrating one example of components of an RX SerDes interface and an RX FIFO, including a reference clock phase adjustor that is adjustable for dynamically adjusting a reference clock phase to minimize uncertainty at a clock boundary through RX FIFO to a half a cycle granularity of delay.

FIG. 3 illustrates a block diagram of one example of components of an RX SerDes interface and an RX FIFO, including a reference clock phase adjustor that is adjustable for dynamically adjusting a reference clock phase to minimize uncertainty at a clock boundary through RX FIFO to a half a cycle granularity of delay.

In one example, a receive clock domain 302 includes data 222 received by chip 120 from off-chip through HSS channel 114, illustrated including serialized data 310 of four beats of data in series "D0", "D1", "D2", and "D(N−1)". In additional or alternate examples, data 222 may include additional or alternate numbers of beats of serialized data. In one example, data 222 passes through a continuous time linear equalizer (CTLE) 314 coupled to a sampler decision feedback equalizer (DFE) 316. In one example, sampler DFE 316 may sample serialized data 310 on a rising and falling edge of a clock signal I/O CLK1 220, illustrated by clock 304. In one example, a 2:N clock divider 328 may divide clock signal I/O CLK1 220 by N into a clock signal I/O CLK2 242. In one example, 2:N clock divider 328 may be implemented through one or more types of clock dividers. In one example, 2:N clock divider 328 may be implemented as a binary counter that increments by one each cycle, such that the least significant bit of the counter would be a clock with half the frequency of the input clock signal of I/O CLK1 220, the next least significant bit would be a quarter frequency, and each additional least significant bit would be half of the frequency of the previous least significant bit. In another example, 2:N clock divider 328 may be implemented as a first latch that toggles each cycle, which would generate a half frequency clock, which could be used to clock another toggle a second latch to make a quarter rate clock, and each additional rate clock would be generated by a next latch toggled by the previous clock.

In one example, a 2:N deserializer 318 receives sampled data 320 and based on I/O CLK 2 242, deserializes sampled data 320 such that each of the N beats of serialized data 310 is output in parallel as N bits of parallel data 322, illustrated as separate beats "D0", "D1", "D2", and "D(N−1)". In an additional or alternate example, 2:N deserializer 318 may implement or more type of deserialization and may implement one or more tiers of deserialization components.

In one example, parallel data 322 may be buffered by RX FIFO 124, latching on either a rising edge or a falling edge of a load pointer from a load counter 332, which is driven by I/O CLK2 242. In one example, once parallel data 322 is latched into RX FIFO 124, the data reaches clock boundary 134.

In one example, data latched in RX FIFO 124 may be captured in chip clock domain 304 on the rising and falling edges of chip clock 304, through a FIFO entry selection of an unload pointer signal from unload counter 334, which is clocked with chip clock 304. In one example, a data out F 324 is the output from RX FIFO 124 on a falling edge of chip clock 304 from an unload pointer signal of unload counter 334 and a data out R 326 is the output from RX FIFO 124 on a rising edge of chip clock 304 from an unload pointer signal of unload counter 334. In one example, a compare gate 338 compares data out F 324 with data out R 326 and outputs a result RF_COMPARE 346 indicating whether data out F 324 and data out R 326 match. In addition, an XOR gate 340 compares data out R 326 with an output from a pattern descrambler 342 and outputs resulting data 344 indicating whether data out R 326 and pattern descrambler 342 match. In one example, each of compare gate 338 and compare gate 340 may represent one or more types of comparison gates including, but not limited to, an N:1 NOR gate, performing a bit-wise XOR compare. In additional or alternate examples, pattern scrambler 342 may represent one or more types of data scramblers, such as a pseudo-random binary sequence (PRBS) descrambler, or other types of pattern generators, which may generate one more types of patterns of data.

In one example, chip clock 126 and a hardware (HW) state machine 350 may drive unload counter 334. In addition, chip clock 126 and HW state machine 350 may drive pattern descrambler 342. In one example, HW state machine 350 may include an M setting 352, which sets a value for an M number of clock cycles of delay to apply to unload counter 334 and pattern descrambler 342, to set a load to unload delay setting, which is reflected in clock crossing uncertainty 116. In one example, HW state machine 350 may control a hold pulse input 354, controllable by HW calibration controller 132 during a calibration line test to direct unload pointer 334 to hold a pulse from chip clock 126 for one or more clock cycles. In one example, HW state machine 350 may include a skip pulse input 356, controllable by HW calibration controller 132 during a calibration line test to direct unload counter 334 to skip a pulse from chip clock 126 for one or more clock cycles.

In one example, HW calibration controller 132 may control a line test sequence, with a link training pattern set for learning a phase difference between I/O CLK2 242 and chip clock 126. First, for M setting 352 set to an initial delay, HW calibration controller 132 may run an initial line test cycle and determine if there are any bit errors by observing data 344, which represents bit compares between data out R 326 and pattern descrambler 342. In one example, with the link training pattern used, the expected output for link training pattern output is an output from XOR 340 of "0", unless there is a bit error. In one example, the link training pattern may include one or more types of patterns formatted for pattern descrambler 342 or other components, such as, but not limited to, a pseudo-random bit sequence (PRBS) of length 2 to the 23 power (PRBS23) and a pseudo-random bit sequence (PRBS) of length 2 to the 31 power (PRBS31).

In one example, if HW calibration controller 132 does not detect any bit errors, HW calibration controller 132 may decrement the load to unload delay by advancing unload counter 334 and pattern descrambler 342 by two chip clock cycles in one line test cycle. In one example, HW calibration controller 132 may advance unload counter 334 and pattern descrambler 342 by 2 chip clock cycles in one line test cycle by triggering hold pulse input 354 for two clock cycles of chip clock 126. HW calibration controller 132 may then observe data 344 to determine if there are any bit errors. If there are no bit errors, HW calibration controller 132 may continue the cycle of decrementing the load to unload delay by advancing unload counter 334 and pattern descrambler 342 by two chip clock cycles in one line test cycle, performed by HW calibration controller 132 triggering hold pulse input 354 for two clock cycles of chip clock 126 in one line test cycle, until data 344 shows bit errors.

Once data 344 shows bit errors, HW calibration controller 132 may increment the load to unload delay by freezing unload counter 334 and pattern descrambler 342 for one chip clock cycle of chip clock 126 in one line test cycle and then capturing and comparing the result of the main rising edge cycle of data out R 326 and the prior data out F 324, from RF_compare 346, to determine the margin. In one example, HW calibration controller 132 may freeze unload counter 334 and pattern descrambler 342 for one chip clock cycle of chip clock 126 of one line test cycle by triggering skip pulse input 356 for one chip clock cycle.

If RF_compare 346 shows the rising and falling edge samples match, then there is a half cycle of margin on the unload latch of RX FIFO 124 in unload counter 334 and HW calibration controller 132 may determine whether the PLL drift is less than M+½ cycles, where M is a whole number greater than or equal to 0. In one example, the PLL drift may refer to a system specification indicating a maximum drift of chip clock 126. In addition, the PLL drift may include drift between the two clock sources of I/O CLK 112 and chip 126 caused by one or more additional factors including, but not limited to wire-interconnect lengths, variations in temperature, timing variations, frequency variations, aging, material imperfections, and other skew factors present on chip 120.

In one example, to determine whether the PLL drift is less than M+½ cycles, HW calibration controller 132 compares M+½ with a PLL drift system specification. In one example, the PLL drift system specification may be a static value set at a design stage or production stage for PLL 128. In another example, the PLL drift system specification may be a dynamically selectable system specification value. In one example, if the PLL drift specification is set to "2.1" and M is set to "2", then HW calibration controller 132 may determine that the PLL drift is less than M+½, or "2.5". In another example, if the PPL drift specification is set to "2.9" and M is set to "2", then HW calibration controller 132 may determine that the PLL drift is not less than M+½ or "2.5".

If the PLL drift is less than M+½ cycles, then HW calibration controller 132 increments the load to unload delay setting by M setting 352, and the calibration is complete. Otherwise, if the PLL drift is not less than M+½ cycles, then HW calibration controller 132 may invert the PLL reference clock by setting INV 214 to invert the phase of REF 212 through XOR 212, HW calibration controller 132 may decrement the load to unload delay by advancing unload counter 334 and pattern descrambler 342 by two chip clock cycles in one line test cycle, and HW calibration controller 132 may then observe data 344 to determine if there are any bit errors. If there are no bit errors, HW calibration controller 132 may continue the cycle of decrementing the load to unload delay by advancing unload counter 334 and pattern descrambler 342 by two chip clock cycles in one line test cycle, performed by HW calibration controller 132 triggering hold pulse input 354 for two clock cycles in one line test cycle of chip clock 126, until data 344 shows bit errors. Once data 344 shows bit errors, HW calibration controller 132 may increment the load to unload delay by freezing unload counter 334 and pattern descrambler 342 for one chip clock cycle of chip clock 126 in one line test cycle, increment the load to unload delay by M setting 352, and the calibration is complete.

Alternatively, if RF_compare 346 shows the rising and falling edge samples do not match, then is no margin on the unload latch of RX FIFO 124 in unload counter 334 and HW calibration controller 132 may determine whether the PLL drift is less than M+½ cycles, where M is a whole number greater than or equal to 0. If the PLL drift is not less than M+½ cycles, then HW calibration controller 132 increments the load to unload delay setting by M setting 352, and the calibration is complete. Otherwise, if the PLL drift is less than M+½ cycles, then HW calibration controller 132 may invert the PLL reference clock by setting INV 214 to invert the phase of REF 212 through XOR 212, HW calibration controller 132 may decrement the load to unload delay by advancing unload counter 334 and pattern descrambler 342 by two chip clock cycles in one line test cycle, and HW calibration controller 132 may then observe data 344 to determine if there are any bit errors. If there are no bit errors, HW calibration controller 132 may continue the cycle of decrementing the load to unload delay by advancing unload counter 334 and pattern descrambler 342 by two chip clock cycles in one line test cycle, performed by HW calibration controller 132 triggering hold pulse input 354 for two clock cycles of chip clock 126 for one line test cycle, until data 344 shows bit errors. Once data 344 shows bit errors, HW calibration controller 132 may increment the load to unload delay by freezing unload counter 334 and pattern descrambler 342 for one chip clock cycle of chip clock 126 in one line test cycle, increment the load to unload delay by M setting 352, and the calibration is complete.

Figure 4:
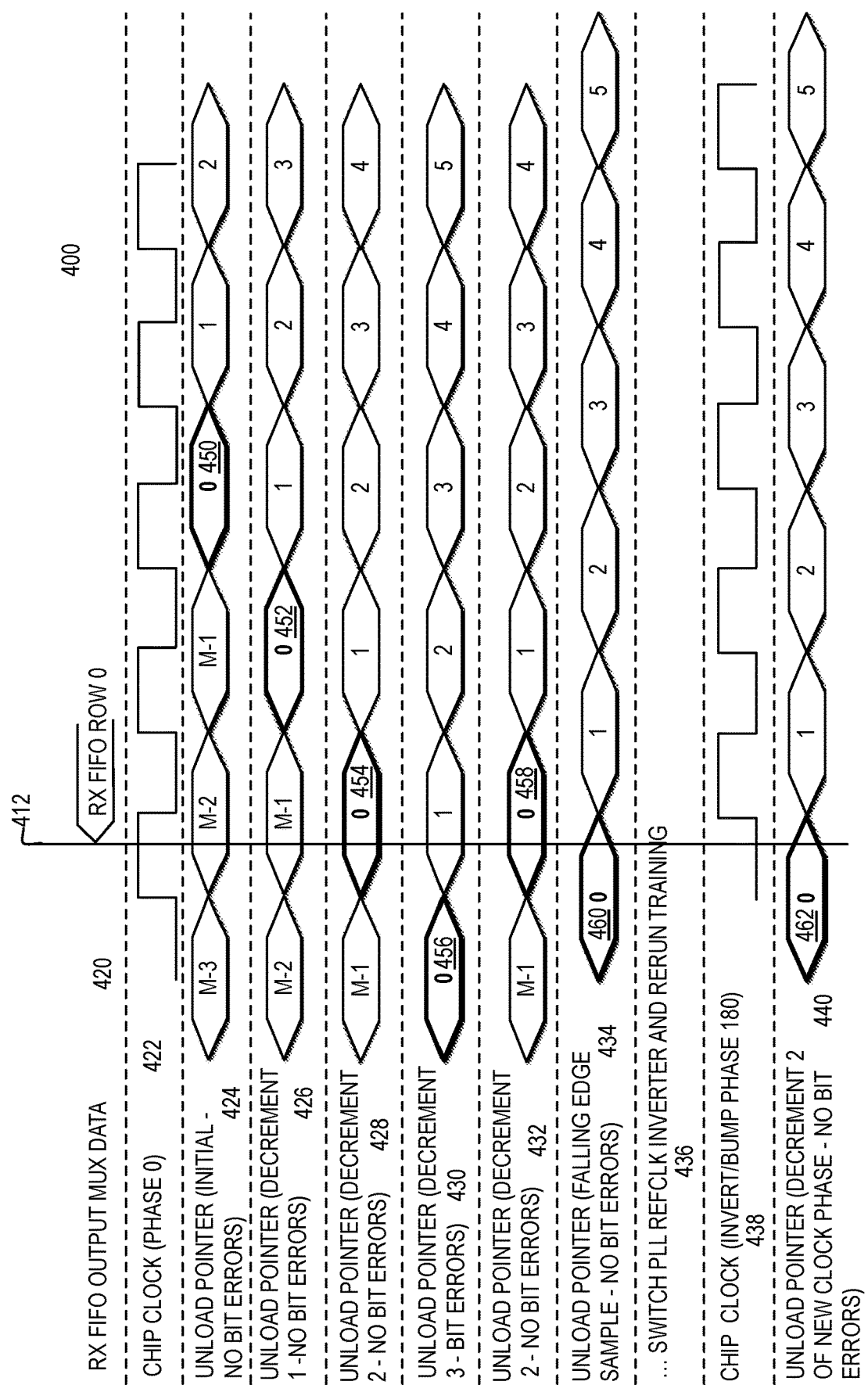
FIG. 4 is a block diagram illustrating one example of a timing diagram illustrating multiple line tests controlled by a HW calibration controller for learning a phase difference at a clock boundary and dynamically adjusting a REF CLK to control a delay at the clock boundary to a granularity of a half a clock cycle delay.

FIG. 4 illustrates a timing diagram of one example of multiple line tests controlled by a HW calibration controller for learning a phase difference at a clock boundary and dynamically adjusting a REF CLK to control a delay at the clock boundary to a granularity of a half a clock cycle delay.

In one example, a line 420 of a timing diagram 400 in FIG. 4 illustrates the timing of the output of a first row of data within RX FIFO 124, illustrated as "RX FIFO ROW 0". In one example, RX FIFO 124 may include a buffer of several rows of data of width "N", where the data is written into a row address referenced by load counter 332. In the example, the first row of data within RX FIFO 124 illustrated in line 420 may be read from a row address referenced by unload counter 334, and then may be captured in a chip clock latch within RX FIFO 124 before output as data 248. In particular, in the example, where RX FIFO 124 includes a chip clock latch that is driven by chip clock 126, "RX FIFO ROW 0" represent a row of data that has not yet been latched by the chip clock latch, however data 248 represents the row of data output from the chip clock latch on the output of RX FIFO 124.

In the example, a phase of chip clock 126 is illustrated in line 422. In one example, an output time 412 illustrates the start of the output of a first row of data 248 from RX FIFO 124. In one example, HW calibration controller 132 calibrates a phase of chip clock 126 in relation to a phase of I/O CLK2 242 to control the delay at clock boundary 134 to a granularity of half a clock cycle delay, by learning a sampling margin and dynamically determining whether to invert REF CLK 118.

In the example, a line 424 illustrates an initial timing of an unload pointer from unload counter 334, for an initial line test sequence with an initial load to unload delay from output time 412 to cycle 450, where HW calibration controller 130 does not detect any bit errors from the output of data 344 for the delay applied to clock boundary 134 by unload counter 334. In the example, the initial load to unload delay from output time 412 to cycle 450 indicates that the delay is set to a safe sampling window of RX FIFO 124.

In the example, HW calibration controller 130 may decrement the load to unload delay by advancing the unload pointer from unload counter 334 and pattern descrambler 342 by two chip clock cycles in one line test cycle and run the line test sequence, resulting in a load to unload delay from output time 412 to cycle 452. For example, if unload counter 334 continuously counts with the sequence {0, 1, 2, 3, 4, 5, 6, 7, 0, 1, 2, . . . } on each chip clock cycle, then HW calibration controller 130 would decrement the load to unload delay of the FIFO by advancing the state of unload counter 334 by the equivalent of two chip clock cycles such as in the sequence {0, 1, 3, 4, 5, 6, 7, 0, 1, 2, . . . }, where the count is advanced from '1' directly to '3' in one chip clock cycle. As illustrated at line 426, HW calibration controller 130 does not detect any bit errors from the output of data 344 for the delay applied to clock boundary 134 by unload counter 334. In the example, the load to unload delay from output time 412 to cycle 452 indicates that the delay is still set to a safe sampling window of RX FIFO 124.

In the example, HW calibration controller 130 may again decrement the load to unload delay by advancing the unload pointer from unload counter 334 and pattern descrambler 342 by two chip clock cycles in one line test cycle and run the line test sequence, resulting in a load to unload delay from output time 412 to cycle 454. As illustrated at line 428, HW calibration controller 130 does not detect any bit errors from the output of data 344 for the delay applied to clock boundary 134 by unload counter 334. In the example, the load to unload delay from output time 412 to cycle 454, where cycle 454 intersects with output time 412, illustrates that cycle 454 is the first test cycle where the delay is minimized, but RX FIFO 124 is validly functioning, where it is still safe to unload data from RX FIFO 124.

In the example, HW calibration controller 130 may again decrement the load to unload delay by advancing the unload pointer from unload counter 334 and pattern descrambler 342 by two chip clock cycles in one line test cycle and run the line test sequence, resulting in a load to unload delay from output time 412 to cycle 456. As illustrated at line 430, HW calibration controller 130 does detect bit errors from the output of data 344 for the delay applied to clock boundary 134 by unload counter 334. In the example, the load to unload delay from output time 412 to cycle 456 results in errors, which allows for HW calibration controller 130 to next determine the margin available for adjusting the phase of the chip clock to minimize latency to a half cycle of granularity.

In the example, HW calibration controller 130 may increment the load to unload delay by decreasing the unload pointer from unload counter 334 and pattern descrambler 342 for one chip clock cycle in one line test cycle, such as by selecting skip pulse input 356 for one cycle, and run the line test sequence, resulting in a load to unload delay from output time 412 to cycle 458. As illustrated at line 432, HW calibration controller 130 does not detect bit errors. In the example, line 434 illustrates the data captured for the for the falling edge sample at the current load to unload delay. As illustrated at line 434, HW calibration controller 130 may capture and compare the result of the main rising edge unload sample and the prior falling edge unload sample to determine whether there is any margin. In the example, if the main rising edge unload sample and the prior falling edge unload sample match, as is illustrated by cycle 458 matching cycle 460, then there is a half cycle of margin available.

In the example, as illustrated at line 436, HW calibration controller 130 may dynamically select to switch PLL reference clock phase adjustor 140, such as by adjusting a setting of INV 214 to XOR 210, and rerun one or more line test sequences for training and calibration. In the example, line 438 illustrates chip clock 126, as inverted, with a 180 phase bump. In the example, HW calibration controller 130 may rerun the training by decrementing two of the new clock phase cycles for one line test cycle, resulting in a load to unload delay from output time 130 to cycle 462, with no bit errors.

In the example, HW calibration controller 130 initially determined a minimum whole cycle delay to control a first cycle during which it is safe to unload data from RX FIFO 124 and then determined an additional half cycle of precision granularity for the delay across RX FIFO 124 by dynamically selecting a clock phase of the REF CLK.

Figure 5:
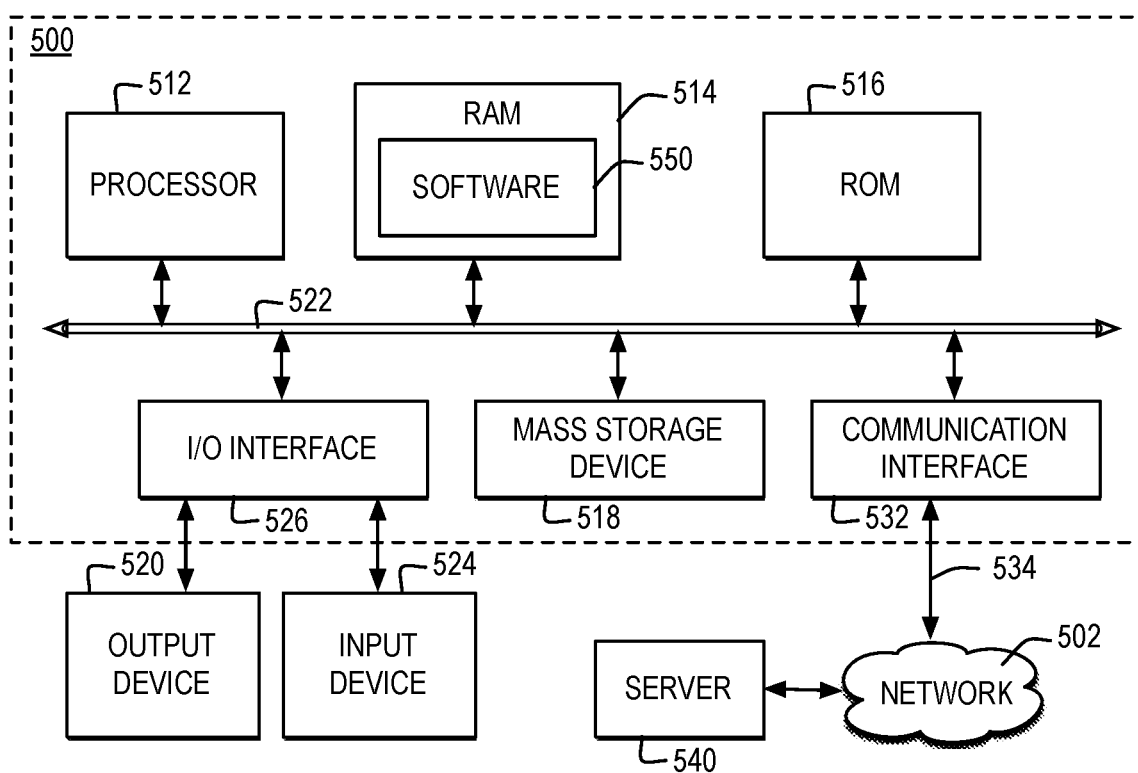
FIG. 5 is a block diagram illustrating one example of a computer system in which one embodiment of the invention may be implemented.

FIG. 5 illustrates a block diagram of one example of a computer system in which one embodiment of the invention may be implemented. The present invention may be performed in a variety of systems and combinations of systems, made up of functional components, such as the functional components described with reference to a computer system 500 and may be communicatively connected to a network, such as network 502.

Computer system 500 includes a bus 522 or other communication device for communicating information within computer system 500, and at least one hardware processing device, such as processor 512, coupled to bus 522 for processing information. Bus 522 preferably includes low-latency and higher latency paths that are connected by bridges and adapters and controlled within computer system 500 by multiple bus controllers. When implemented as a server or node, computer system 500 may include multiple processors designed to improve network servicing power.

Processor 512 may be at least one general-purpose processor that, during normal operation, processes data under the control of software 550, which may include at least one of application software, an operating system, middleware, and other code and computer executable programs accessible from a dynamic storage device such as random access memory (RAM) 514, a static storage device such as Read Only Memory (ROM) 516, a data storage device, such as mass storage device 518, or other data storage medium. Software 550 may include, but is not limited to, code, applications, protocols, interfaces, and processes for controlling one or more systems within a network including, but not limited to, an adapter, a switch, a server, a cluster system, and a grid environment.

Computer system 500 may communicate with a remote computer, such as server 540, or a remote client. In one example, server 540 may be connected to computer system 500 through any type of network, such as network 502, through a communication interface, such as network interface 532, or over a network link that may be connected, for example, to network 502.

In the example, multiple systems within a network environment may be communicatively connected via network 502, which is the medium used to provide communications links between various devices and computer systems communicatively connected. Network 502 may include permanent connections such as wire or fiber optics cables and temporary connections made through telephone connections and wireless transmission connections, for example, and may include routers, switches, gateways and other hardware to enable a communication channel between the systems connected via network 502. Network 502 may represent one or more of packet-switching based networks, telephony based networks, broadcast television networks, local area and wire area networks, public networks, and restricted networks.

Network 502 and the systems communicatively connected to computer 500 via network 502 may implement one or more layers of one or more types of network protocol stacks which may include one or more of a physical layer, a link layer, a network layer, a transport layer, a presentation layer, and an application layer. For example, network 502 may implement one or more of the Transmission Control Protocol/Internet Protocol (TCP/IP) protocol stack or an Open Systems Interconnection (OSI) protocol stack. In addition, for example, network 502 may represent the worldwide collection of networks and gateways that use the TCP/IP suite of protocols to communicate with one another. Network 502 may implement a secure HTTP protocol layer or other security protocol for securing communications between systems.

In the example, network interface 532 includes an adapter 534 for connecting computer system 500 to network 502 through a link and for communicatively connecting computer system 500 to server 540 or other computing systems via network 502. Although not depicted, network interface 532 may include additional software, such as device drivers, additional hardware and other controllers that enable communication. When implemented as a server, computer system 500 may include multiple communication interfaces accessible via multiple peripheral component interconnect (PCI) bus bridges connected to an input/output controller, for example. In this manner, computer system 500 allows connections to multiple clients via multiple separate ports and each port may also support multiple connections to multiple clients.

Figure 6:
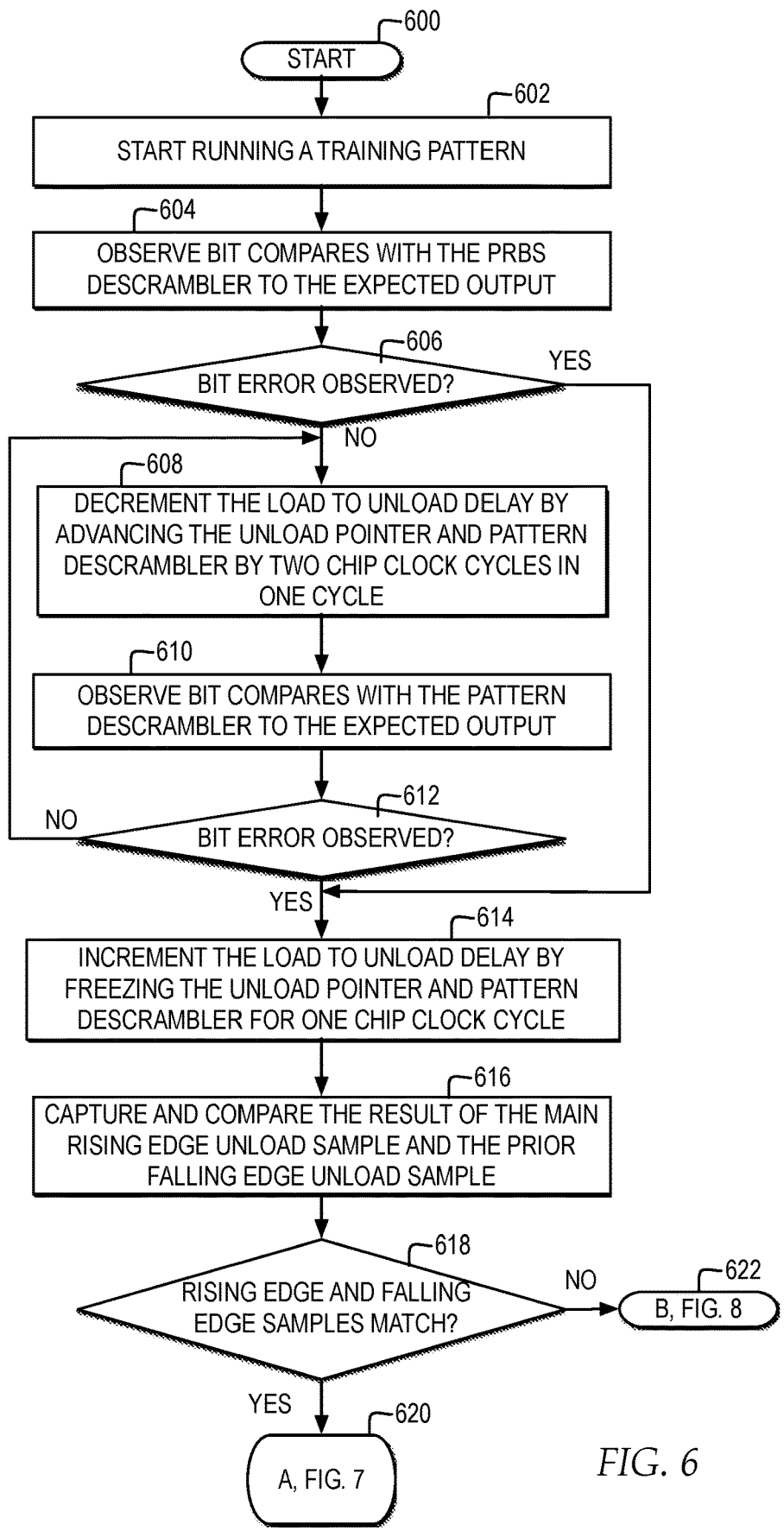
FIG. 6 illustrates a high level logic flowchart of a process and computer program for reducing chip latency by minimizing uncertainty at a clock boundary by determining a load to unload delay in which rising edge and falling edge samples match.
Figure 7:
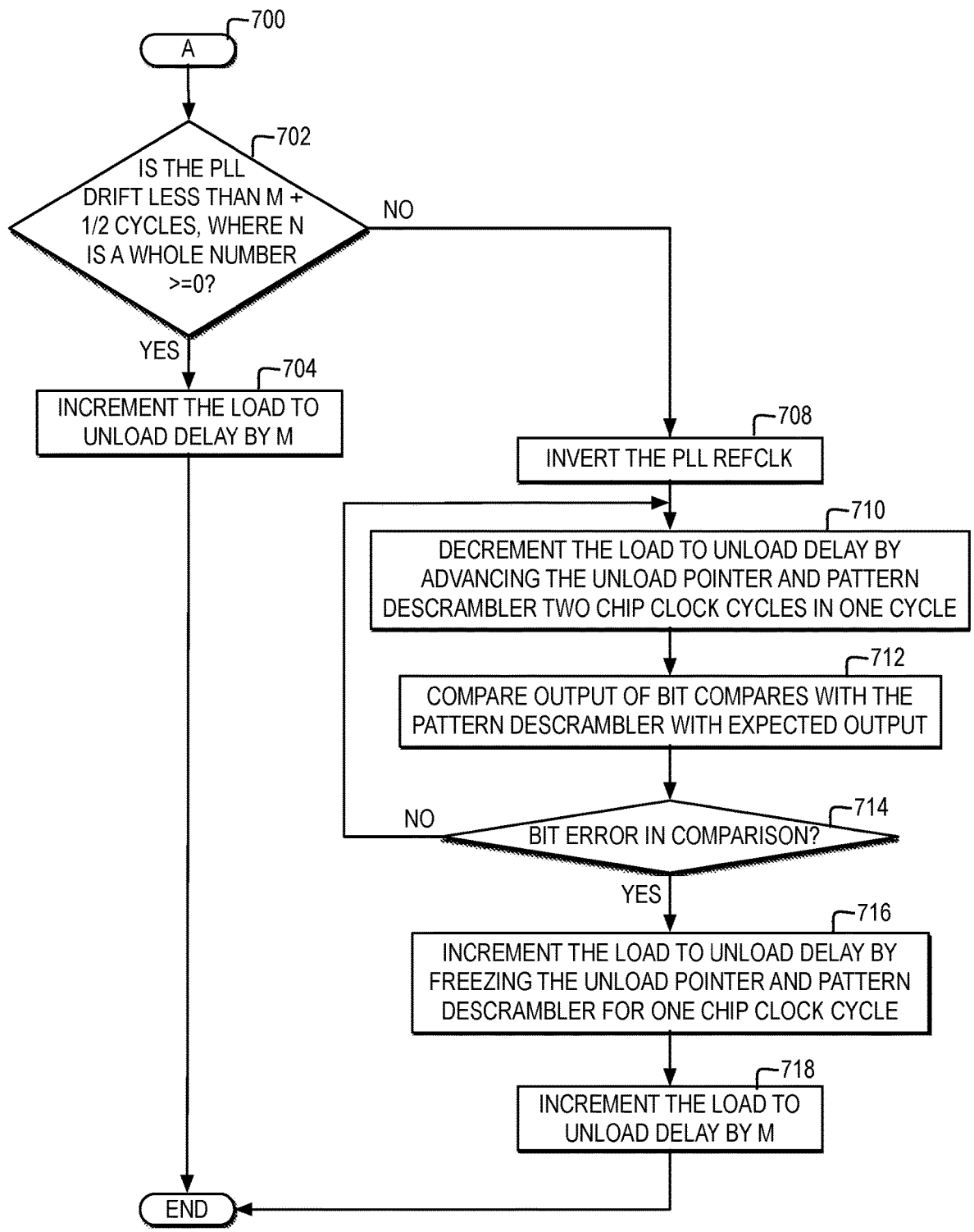
FIG. 7 illustrates a high level logic flowchart of a process and computer program for reducing chip latency by minimizing uncertainty at a clock boundary by determining when there is a half cycle of margin on an unload latch and dynamically adjusting a phase of a reference clock to control a delay at the clock boundary to a granularity of a half a clock cycle delay.
Figure 8:
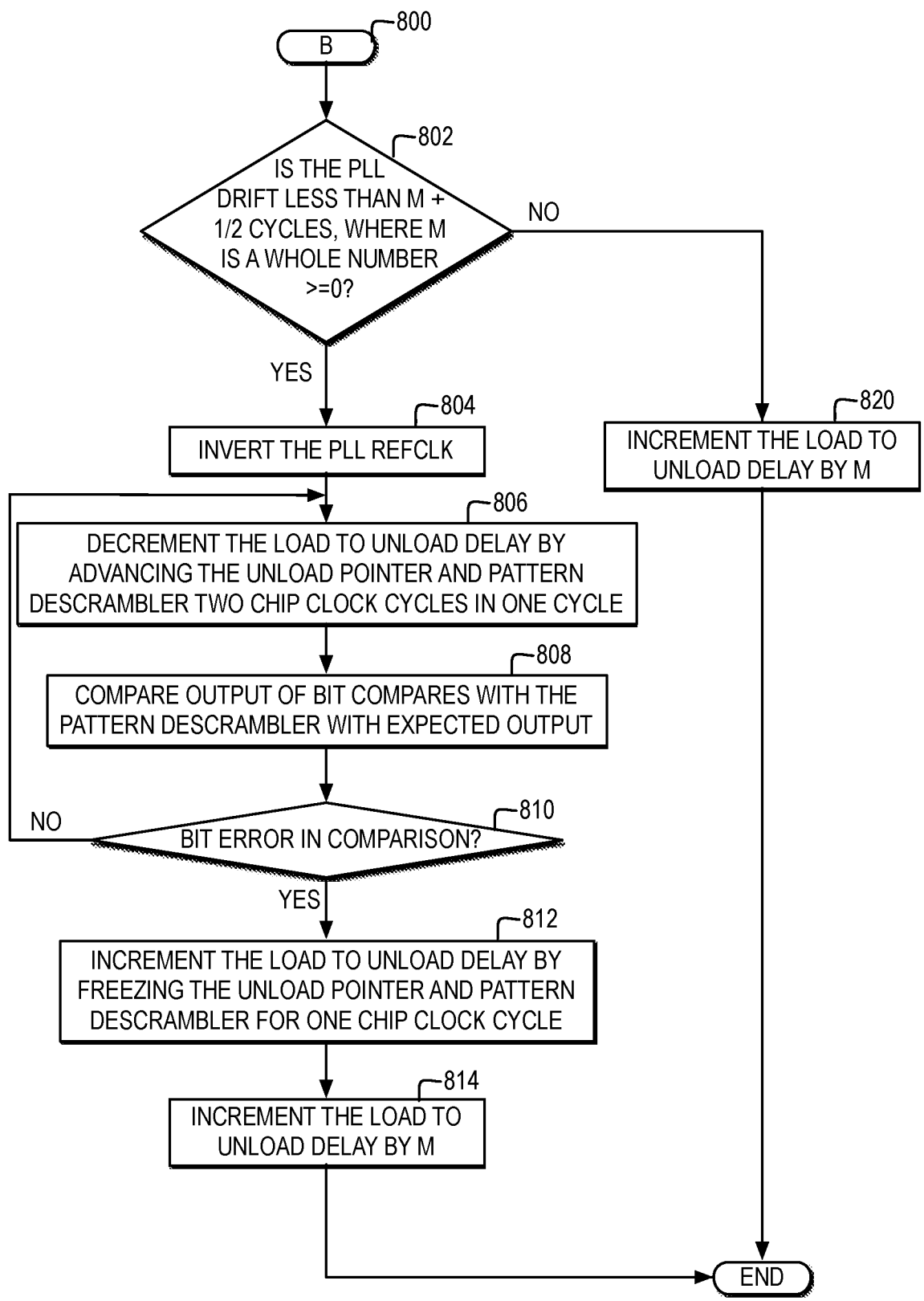
FIG. 8 illustrates a high level logic flowchart of a process and computer program for reducing chip latency by minimizing uncertainty at a clock boundary by determining when there is not any margin on an unload latch and dynamically adjusting a phase of a reference clock to control a delay at the clock boundary to a granularity of a half a clock cycle delay.

In one embodiment, the operations performed by processor 512 may control the operations of flowchart of FIGS. 6-8 and other operations described herein. Operations performed by processor 512 may be requested by software 550 or other code or the steps of one embodiment of the invention might be performed by specific hardware components that contain hardwired logic for performing the steps, or by any combination of programmed computer components and custom hardware components. In one embodiment, one or more components of computer system 500, or other components, which may be integrated into one or more components of computer system 500, may contain hardwired logic for performing the operations of flowcharts in FIGS. 6-8.

In addition, computer system 500 may include multiple peripheral components that facilitate input and output. These peripheral components are connected to multiple controllers, adapters, and expansion slots, such as input/output (I/O) interface 526, coupled to one of the multiple levels of bus 522. For example, input device 524 may include, for example, a microphone, a video capture device, an image scanning system, a keyboard, a mouse, or other input peripheral device, communicatively enabled on bus 522 via I/O interface 526 controlling inputs. In addition, for example, output device 520 communicatively enabled on bus 522 via I/O interface 526 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 5, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely, propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may, represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 5 may vary. Furthermore, those of ordinary skill in the art will appreciate that the depicted example is not meant to imply architectural limitations with respect to the present invention.

FIG. 6 illustrates a high level logic flowchart of a process and computer program for reducing chip latency by minimizing uncertainty at a clock boundary by determining a load to unload delay in which rising edge and falling edge samples match.

In one example, the process and computer program begins at block 600 and thereafter proceeds to block 602. Block 602 illustrating starting to run a training pattern. Next, block 604 illustrates observing bit compares with the pattern descrambler to the expected output. Thereafter, block 606 illustrates a determination whether a bit error is observed. At block 606, if a bit error is observed, then the process passes to block 614. At block 606, if a bit error is not observed, then the process passes to block 608.

Block 608 illustrates decrementing the load to unload delay by advancing the unload pointer and pattern descrambler by two chip clock cycles in one line test cycle. Next, block 610 illustrates observing bit compares with the pattern descrambler to the expected output. Thereafter, block 612 illustrates a determination whether a bit error is observed. At block 612, if a bit error is not observed, then the process returns to block 608. At block 612, if a bit error is observed, then the process passes to block 614.

Block 614 illustrates incrementing the load to unload delay by freezing the unload pointer and pattern descrambler for one chip clock cycle in one line test cycle. Next, block 616 illustrates capturing and comparing the result of the main rising edge unload sample and the prior falling edge unload sample. Thereafter, block 618 illustrates a determination whether the rising edge and falling edge samples match. At block 618, if the rising edge and falling edge samples do not match, then the process passes to block 622. Block 622 proceeds to starting block "B" of FIG. 8. Otherwise, returning to block 618, if the rising edge and falling edge samples match, then the process passes to block 620. Block 620 proceeds to starting block "A" of FIG. 7.

FIG. 7 illustrates a high level logic flowchart of a process and computer program for reducing chip latency by minimizing uncertainty at a clock boundary by determining when there is a half cycle of margin on an unload latch and dynamically adjusting a phase of a reference clock to control a delay at the clock boundary to a granularity of a half a clock cycle delay.

In one example, the process and program starts at block 700 and thereafter proceeds to block 702. Block 702 illustrates a determination whether the PLL drift is less than M+½ cycles, where M is a whole number greater than or equal to 0. At block 702, if the PLL drift is less than M+½ cycles, where M is a whole number greater than or equal to 0, then the process passes to block 704. Block 704 illustrates incrementing the load to unload delay by M, and the process ends.

Returning to block 702, at block 702 if the PLL drift is not less than M+½ cycles, where M is a whole number greater than or equal to 0, then the process passes to block 708. Block 708 illustrates inverting the PLL ref clock. Next, block 710 illustrates decrementing the load to unload delay by advancing the unload pointer and pattern descrambler two chip clock cycles in one line test cycle. Thereafter, block 712 illustrates comparing output of bit compares with the pattern descrambler with expected output. Next, block 714 illustrates a determination whether there is a bit error in the comparison. At block 714, if there is not a bit error in the comparison, then the process returns to block 710. Otherwise, at block 714, if there is a bit error in the comparison, then the process passes to block 716. Block 716 illustrates incrementing the load to unload delay by freezing the unload pointer and pattern descrambler for one chip clock cycle in one line test cycle. Next, block 718 illustrates incrementing the load to unload delay by M, and the process ends.

FIG. 8 illustrates a high level logic flowchart of a process and computer program for reducing chip latency by minimizing uncertainty at a clock boundary by determining when there is not any margin on an unload latch and dynamically adjusting a phase of a reference clock to control a delay at the clock boundary to a granularity of a half a clock cycle delay.

In one example, the process and program starts at block 800 and thereafter proceeds to block 802. Block 802 illustrates a determination whether the PLL drift is less than M+½ cycles, where M is a whole number greater than or equal to 0. At block 802, if the PLL drift is not less than M+½ cycles, where M is a whole number greater than or equal to 0, then the process passes to block 820. Block 820 illustrates incrementing the load to unload delay by M, and the process ends.

Returning to block 802, at block 802 if the PLL drift is less than M+½ cycles, where M is a whole number greater than or equal to 0, then the process passes to block 804. Block 804 illustrates inverting the PLL ref clock. Next, block 806 illustrates decrementing the load to unload delay by advancing the unload pointer and pattern descrambler two chip clock cycles in one line test cycle. Thereafter, block 808 illustrates comparing output of bit compares with the pattern descrambler with expected output. Next, block 810 illustrates a determination whether there is a bit error in the comparison. At block 810, if there is not a bit error in the comparison, then the process returns to block 806. Otherwise, at block 806, if there is a bit error in the comparison, then the process passes to block 812. Block 812 illustrates incrementing the load to unload delay by freezing the unload pointer and pattern descrambler for one chip clock cycle in one line test cycle. Next, block 814 illustrates incrementing the load to unload delay by M, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method comprising:
   learning, by a computer system, a difference between a first clock phase of an input clock for controlling inputs on a data path to a buffer of a receiving chip at a clock boundary and a second clock phase of a chip clock for controlling outputs from the buffer on the data path at the clock boundary by:
      running, by the computer system, a first test line sequence on the data path comprising a plurality of line test cycles;

observing, by the computer system, a comparison of data rising output from the buffer on a rising edge of the chip clock compared with an output of a pattern generator in comparison with an expected output;

in response to the comparison matching the expected output, decrementing, by the computer system, a load to unload delay across the clock boundary by advancing each of an unload pointer for controlling output from the buffer and the pattern generator by two chip clock cycles in one line test cycle of the plurality of line test cycles;

observing, by the computer system, the comparison of the data rising output from the buffer on the rising edge of the chip clock compared with the output of the pattern generator in comparison with the expected output;

in response to the comparison not matching the expected output, incrementing, by the computer system, the load to unload delay by freezing each of the unload pointer and the pattern generator by one chip clock cycle in the one line test cycle; and capturing and comparing, by the computer system, the data rising output from the buffer on the rising edge of the chip clock compared with the data falling output from the buffer on the falling edge of the chip clock; and dynamically adjusting, by the computer system, a phase of a reference clock driving a phase locked loop that outputs the chip clock to adjust the second clock phase of the chip clock with respect to the first clock phase to minimize a latency on the data path at the clock boundary to a half a cycle granularity.

2. The method according to claim 1, wherein learning, by a computer system, a difference between a first clock phase of an input clock for controlling inputs on a data path to a buffer of a receiving chip at a clock boundary and a second clock phase of a chip clock for controlling outputs from the buffer on the data path at the clock boundary further comprises:

learning, by the computer system, the difference between the first clock phase of the input clock and the second phase of the chip clock on the data path of the receiving chip receiving data into the buffer from another chip across a high speed serial interface operating at a first frequency, wherein the first frequency is higher than a second frequency of the chip clock driving the chip.

3. The method according to claim 1, further comprising:

in response to the data rising output matching the data falling output, determining, by the computer system, whether the phase locked loop drift is less than a delay number for the latency plus a half a cycle;

in response to determining the phase locked loop drift is less than a delay number for the latency plus a half a cycle, incrementing, by the computer system, the load to unload delay for triggering loading of the buffer by the input clock to triggering unloading of the buffer by the chip clock by the delay number; and in response to determining the phase locked loop drift is not less than a delay number for the latency plus a half a cycle:

inverting, by the computer system, the phase of the reference clock;

decrementing, by the computer system, the load to unload delay by advancing each of the unload pointer and the pattern generator by two chip clock cycles in the one line test cycle;

observing, by the computer system, the comparison of the data rising output from the buffer on the rising edge of the chip clock compared with the output of the pattern generator in comparison with the expected output;

in response to the comparison not matching the expected output, incrementing, by the computer system, the load to unload delay by freezing each of the unload pointer and the pattern generator by one chip clock cycle in the one line test cycle; and incrementing, by the computer system, the load to unload delay by the delay number.

4. The method according to claim 1, further comprising:

in response to the data rising output not matching the data falling output, determining, by the computer system, whether the phase locked loop drift is less than a delay number for the latency plus a half a cycle;

in response to determining the phase locked loop drift is not less than a delay number for the latency plus a half a cycle, incrementing, by the computer system, the load to unload delay for triggering loading of the buffer by the input clock to triggering unloading of the buffer by the chip clock by the delay number; and in response to determining the phase locked loop drift is less than a delay number for the latency plus a half a cycle:

inverting, by the computer system, the phase of the reference clock;

decrementing, by the computer system, the load to unload delay by advancing each of the unload pointer and the pattern generator by two chip clock cycles in the one line test cycle;

observing, by the computer system, the comparison of the data rising output from the buffer on the rising edge of the chip clock compared with the output of the pattern generator in comparison with the expected output;

in response to the comparison not matching the expected output, incrementing, by the computer system, the load to unload delay by freezing each of the unload pointer and the pattern generator by one chip clock cycle in the one line test cycle; and incrementing, by the computer system, the load to unload delay by the delay number.

5. The method according to claim 1, wherein dynamically adjusting, by the computer system, a phase of a reference clock driving a phase locked loop that outputs the chip clock to adjust the second clock phase of the chip clock with respect to the first clock phase to minimize a latency on the data path at the clock boundary to a half a cycle granularity further comprises:

dynamically adjusting, by the computer system, the second clock phase by adjusting the phase of the reference clock driving the phase locked loop that outputs the chip clock, wherein the phase locked loop comprises an external feedback loop for controlling a deterministic phase of the chip clock.

6. The method according to claim 1, wherein dynamically adjusting, by the computer system, a phase of a reference clock driving a phase locked loop that outputs the chip clock to adjust the second clock phase of the chip clock with respect to the first clock phase to minimize a latency on the data path at the clock boundary to a half a cycle granularity further comprises:

dynamically adjusting, by the computer system, the phase of the reference clock by adjusting an input to an exclusive OR gate to rotate the phase of the reference clock input to the phase locked loop by 180 degrees.

7. A computer system comprising one or more processors, one or more computer-readable memories, one or more computer-readable storage devices, and program instructions, stored on at least one of the one or more storage devices for execution by at least one of the one or more processors via at least one of the one or more memories, the stored program instructions comprising:
 program instructions to learn a difference between a first clock phase of an input clock for controlling inputs on a data path to a buffer of a receiving chip at a clock boundary and a second clock phase of a chip clock for controlling outputs from the buffer on the data path at the clock boundary by:
  program instructions to run a first test line sequence on the data path comprising a plurality of line test cycles;
  program instructions to observe a comparison of data rising output from the buffer on a rising edge of the chip clock compared with an output of a pattern generator in comparison with an expected output;
  in response to the comparison matching the expected output, program instructions to decrement a load to unload delay across the clock boundary by advancing each of an unload pointer for controlling output from the buffer and the pattern generator by two chip clock cycles in one line test cycle of the plurality of line test cycles;
  program instructions to observe the comparison of the data rising output from the buffer on the rising edge of the chip clock compared with the output of the pattern generator in comparison with the expected output program instructions, in response to the comparison not matching the expected output, to increment the load to unload delay by freezing each of the unload pointer and the pattern generator by one chip clock cycle in the one line test cycle; and
  program instructions to capture and compare the data rising output from the buffer on the rising edge of the chip clock compared with the data falling output from the buffer on the falling edge of the chip clock; and
 program instructions to dynamically adjust a phase of a reference clock driving a phase locked loop that outputs the chip clock to adjust the second clock phase of the chip clock with respect to the first clock phase to minimize a latency on the data path at the clock boundary to a half a cycle granularity.

8. The computer system according to claim 7, the stored program instructions further comprising:
 program instructions to learn the difference between the first clock phase of the input clock and the second phase of the chip clock on the data path of the receiving chip receiving data into the buffer from another chip across a high speed serial interface operating at a first frequency, wherein the first frequency is higher than a second frequency of the chip clock driving the chip.

9. The computer system according to claim 7, the stored program instructions further comprising:
 program instructions, in response to the data rising output matching the data falling output, to determine whether the phase locked loop drift is less than a delay number for the latency plus a half a cycle;
 program instructions, in response to determining the phase locked loop drift is less than a delay number for the latency plus a half a cycle, to increment the load to unload delay for triggering loading of the buffer by the input clock to triggering unloading of the buffer by the chip clock by the delay number; and
 program instructions, in response to determining the phase locked loop drift is not less than a delay number for the latency plus a half a cycle to:
  invert the phase of the reference clock;
  decrement the load to unload delay by advancing each of the unload pointer and the pattern generator by two chip clock cycles in the one line test cycle;
  observe the comparison of the data rising output from the buffer on the rising edge of the chip clock compared with the output of the pattern generator in comparison with the expected output;
  in response to the comparison not matching the expected output, increment the load to unload delay by freezing each of the unload pointer and the pattern generator by one chip clock cycle in the one line test cycle; and
  increment the load to unload delay by the delay number.

10. The computer system according to claim 7, the stored program instructions further comprising:
 program instructions, in response to the data rising output not matching the data falling output, to determine whether the phase locked loop drift is less than a delay number for the latency plus a half a cycle;
 program instructions, in response to determining the phase locked loop drift is not less than a delay number for the latency plus a half a cycle, to increment the load to unload delay for triggering loading of the buffer by the input clock to triggering unloading of the buffer by the chip clock by the delay number; and
 program instructions, in response to determining the phase locked loop drift is less than a delay number for the latency plus a half a cycle to:
  invert the phase of the reference clock;
  decrement the load to unload delay by advancing each of the unload pointer and the pattern generator by two chip clock cycles in the one line test cycle;
  observe the comparison of the data rising output from the buffer on the rising edge of the chip clock compared with the output of the pattern generator in comparison with the expected output;
  in response to the comparison not matching the expected output, increment the load to unload delay by freezing each of the unload pointer and the pattern generator by one chip clock cycle in the one line test cycle; and
  increment the load to unload delay by the delay number.

11. The computer system according to claim 7, the stored program instructions further comprising:
 program instructions to dynamically adjust the second clock phase by adjusting the phase of the reference clock driving the phase locked loop that outputs the chip clock, wherein the phase locked loop comprises an external feedback loop for controlling a deterministic phase of the chip clock.

12. The computer system according to claim 7, the stored program instructions further comprising:
 program instructions to dynamically adjust the phase of the reference clock by adjusting an input to an exclusive OR gate to rotate the phase of the reference clock input to the phase locked loop by 180 degrees.

13. A computer program product comprising one or more computer-readable storage devices and program instructions, stored on at least one of the one or more storage devices, the stored program instructions comprising:
  program instructions to learn a difference between a first clock phase of an input clock for controlling inputs on a data path to a buffer of a receiving chip at a clock boundary and a second clock phase of a chip clock for controlling outputs from the buffer on the data path at the clock boundary by:
    program instructions to run a first test line sequence on the data path comprising a plurality of line test cycles;
    program instructions to observe a comparison of data rising output from the buffer on a rising edge of the chip clock compared with an output of a pattern generator in comparison with an expected output;
    in response to the comparison matching the expected output, program instructions to decrement a load to unload delay across the clock boundary by advancing each of an unload pointer for controlling output from the buffer and the pattern generator by two chip clock cycles in one line test cycle of the plurality of line test cycles;
    program instructions to observe the comparison of the data rising output from the buffer on the rising edge of the chip clock compared with the output of the pattern generator in comparison with the expected output;
    program instructions, in response to the comparison not matching the expected output, to increment the load to unload delay by freezing each of the unload pointer and the pattern generator by one chip clock cycle in the one line test cycle; and
    program instructions to capture and compare the data rising output from the buffer on the rising edge of the chip clock compared with the data falling output from the buffer on the falling edge of the chip clock; and
  program instructions to dynamically adjust a phase of a reference clock driving a phase locked loop that outputs the chip clock to adjust the second clock phase of the chip clock with respect to the first clock phase to minimize a latency on the data path at the clock boundary to a half a cycle granularity.

14. The computer program product according to claim 13, the stored program instructions further comprising:
  program instructions to learn the difference between the first clock phase of the input clock and the second phase of the chip clock on the data path of the receiving chip receiving data into the buffer from another chip across a high speed serial interface operating at a first frequency, wherein the first frequency is higher than a second frequency of the chip clock driving the chip.

* * * * *